United States Patent
Huang

[19]

[11] Patent Number: 5,914,512
[45] Date of Patent: Jun. 22, 1999

[54] EXTERNAL CONTACT TO A MOSFET DRAIN FOR TESTING OF STACKED-CAPACITOR DRAMS

[75] Inventor: Julie Huang, Hsin Chu, Taiwan

[73] Assignee: Taiwan Semiconductor Manufacturing Company, Ltd., Hsin-Chu, Taiwan

[21] Appl. No.: 09/083,253

[22] Filed: May 20, 1998

Related U.S. Application Data

[62] Division of application No. 08/787,195, Jan. 22, 1997, Pat. No. 5,783,462.

[51] Int. Cl.⁶ .......................... H01L 27/108; H01L 29/76; H01L 29/94; H01L 31/119
[52] U.S. Cl. .......................... 257/306; 257/296; 257/301; 257/303; 257/68; 257/71
[58] Field of Search ..................................... 257/296, 306, 257/308, 301, 303, 304, 311, 68, 71

[56] References Cited

U.S. PATENT DOCUMENTS

| | | | |
|---|---|---|---|
| 4,970,564 | 11/1990 | Kimura et al. | 29/78 |
| 5,235,549 | 8/1993 | Young et al. | 365/201 |
| 5,292,677 | 3/1994 | Dennison | 437/52 |
| 5,808,855 | 9/1998 | Chan et al. | 257/306 |

Primary Examiner—Valencia Martin-Wallace
Assistant Examiner—Jesse A. Fenty
Attorney, Agent, or Firm—George O. Saile; Stephen B. Ackerman

[57] ABSTRACT

A structure for forming an ohmic contact to the drain of a MOSFET in a stacked capacitor DRAM cell is described. The contact is formed by making an opening in the upper cell plate of the cells capacitor and contacting the storage plate through this opening with a conductive plug, preferably a tungsten plug. The plug is formed concurrent with the conventional contact and first metal wiring processing of the DRAM. The contact is used in DRAM test arrays for characterizing the quality of MOSFET gate insulator as well as the performance characteristics of the MOSFET itself. Connection to the conductive plug is made with first metal wiring. The test structures can be built at any position within the array and since they are located above the polysilicon bitline/wordline structure, the metal connection lines for the contacts do not interfere with the structure of the test array itself other than the sacrifice of the test cell from the array. Multiple devices may be designated from anywhere in the array, and probe contacts may be conveniently located on the chip.

6 Claims, 4 Drawing Sheets

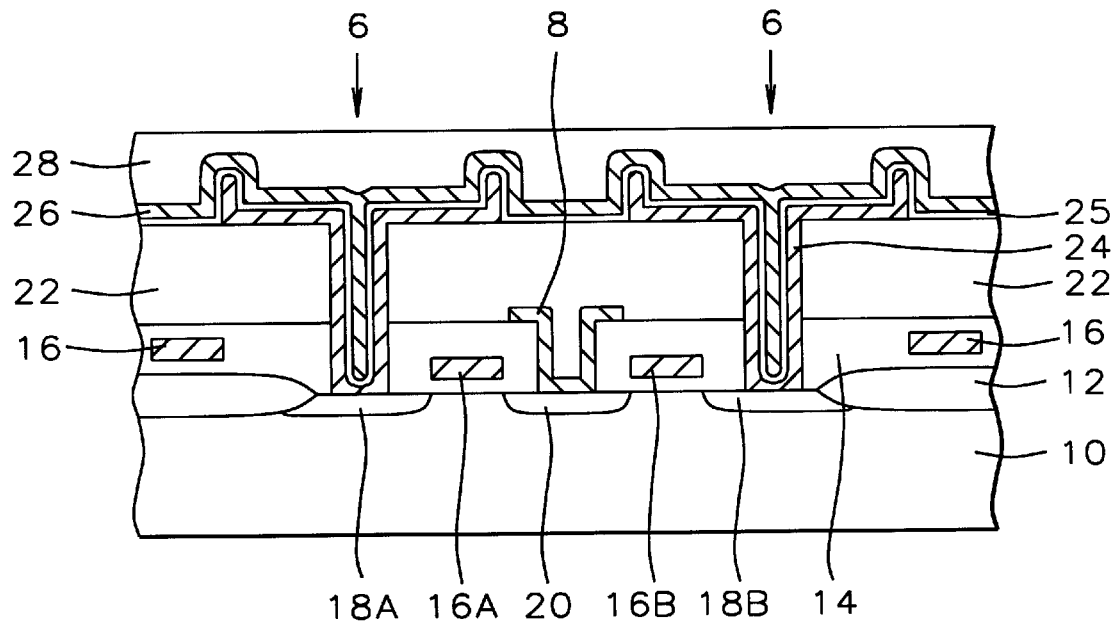
FIG. 1 - Prior Art
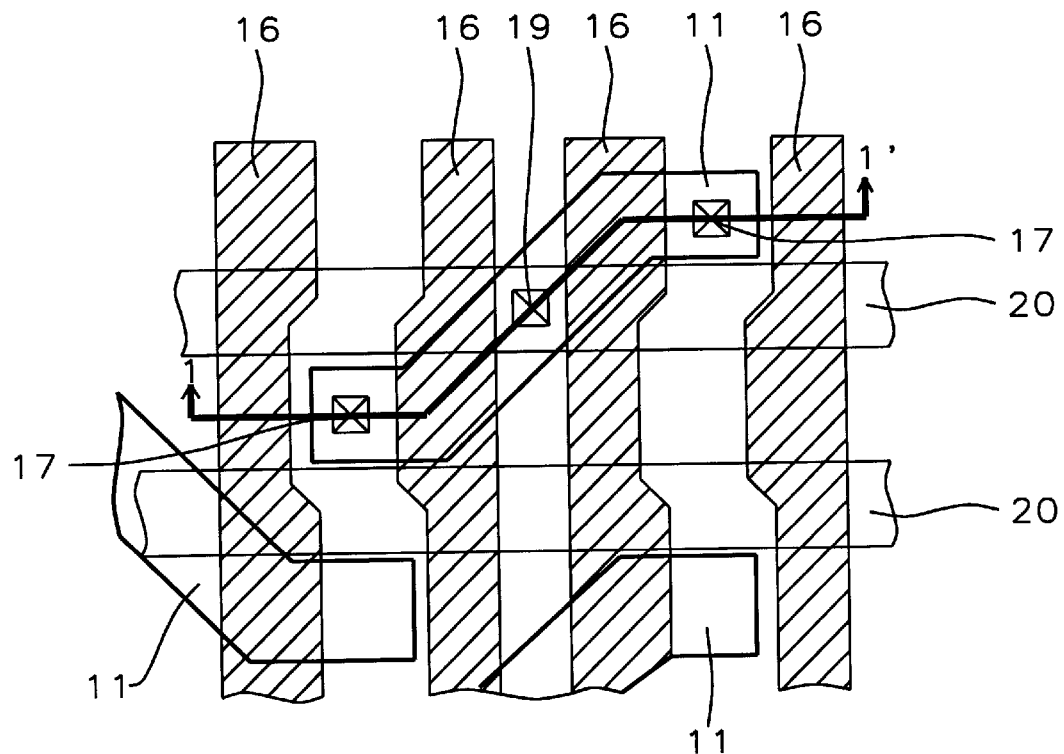
FIG. 2 - Prior Art

EXTERNAL CONTACT TO A MOSFET DRAIN FOR TESTING OF STACKED-CAPACITOR DRAMS

This is a division of patent application Ser. No. 08/787,195, filing date Jan. 22, 1997, U.S. Pat. No. 5,783,462, An External Contact To A Mosfet Drain For Testing Of Stacked-Capacitor Drams, assigned to the same assignee as the present invention.

BACKGROUND OF THE INVENTION (1) Field of the Invention

The invention relates to processes for the manufacture of semiconductor devices and more particularly to DRAM test sites.

(2) Introduction and Description of Prior Art

Computer rememory consist of vast arrays of storage cells which can be addressed by wordlines and bitlines. The most commonly used cell design used in current dynamic-random-access-memories(DRAMs) comprise a transfer gate (usually an MOS field-effect-transistor(MOSFET) and a storage node consisting of a capacitor. DRAM cells are, by necessity of high density requirements, of the simplest design possible and to this end, the MOSFET-capacitor combination serves quite well.

The most exploited design of the MOSFET/capacitor cell has been the stacked capacitor(STC) design wherein the storage capacitor lies entirely above the level of the silicon active areas. In earlier variations the capacitor shared the total available cell area with a bitline contact which passed through to a higher structural level. More recently, Kimura et.al. U.S. Pat. No. 4,970,564 have shown that, by placing the active area at a 45° angle to the perpendicular paths of the bitlines and wordlines, it is possible to also place the bitlines below the main portion of the capacitor, thereby allowing the capacitor to take full advantage of nearly the entire cell area.

The need for such large consumption of cell area by the capacitor has been driven by increasing density requirements resulting in the shrinkage of the cell area itself. A current cell design for a STC capacitor DRAM having diagonal active areas and a capacitor design similar to that of Dennison U.S. Pat. No. 5,292,677 is shown in cross section by FIG. 1 and in a top view by FIG. 2.

Referring first to FIG. 1, two capacitors 6, of a tubular design, are shown formed on a silicon wafer 10. The lower, storage plates 24 contact the source diffusions 18A and 18B of two adjacent MOSFETs whose gates 16A and 16B comprise polysilicon wordlines. The bitline 8 connects to the common drain 20 of the two MOSFETs. The polysilicon wordlines 16 located over field oxide regions 12 service other MOSFETS located in the array above and below the plane of the page. Inter-polysilicon-insulator (IPO) layers 14 and 22 support and insulate the large area portions of the capacitors 6 above the wordline/bitline array. The capacitor dielectric, typically, a composite layer of $SiO_2/Si_3N_4/SiO_2$ (ONO) 25, is covered by the upper cell plate 26 which spans over a plurality of cells and is usually grounded to the wafer 10.

An inter-level-dielectric (ILD) layer 28 insulates the upper cell plate 26 from a subsequently deposited metal layer, which becomes the first level of wiring for the DRAM circuits, Contacts, formed through openings in the ILD connect it to the circuit elements. Most of these contacts are directed to the peripheral circuitry of the DRAM.

Referring now to FIG. 2, a top view of a portion of the DRAM cell array as described by Kimura U.S. Pat. No. 4,970,564 is shown. The cross section of FIG. 2 through the line 1–1' is shown in FIG. 1. The active regions 11, are diagonally disposed to the perpendicular wordlines 16 and bitlines 20. The contact regions of the bitlines 17 and of the capacitor storage plates 19 to the active regions are shown.

A DRAM manufacturing facility requires continuous process monitoring and product testing procedures in order to assure quality product performance and reliability. Functional testing of the product itself, although vitally important, can usually give limited information regarding specific abnormalities. Thus, when product yield falls, the specific causes can seldom be determined from product parameters alone. For this reason test structures are used which are formed along with product, closely resembling product in design and structure, but with certain modifications which allow timely testing for specific performance modes.

One such performance characteristic is the threshold voltage $V_T$ of the MOSFET devices of the cell array. Threshold voltage is defined as the voltage required on the gate electrode of a MOSFET (usually measured with respect to the source voltage) to achieve conduction between the source and drain regions. $V_T$ is measured by applying a voltage between source and drain and measuring the flow of drain current while applying a second voltage on the gate electrode. The threshold voltage is a good indicator of the quality of the gate dielectric. The curves formed by plotting drain current as a function of drain voltage for several values of gate bias is also useful in ascertaining the quality and performance of the MOSFET.

Since the drain of the STC DRAM MOSFET is connected to the plate of a capacitor, a proper connection to the drain cannot be made without modification. The modification must, of course, be made on a DRAM test structure, which closely resembles the DRAM product. The embodiments of this invention describe such a modification of the DRAM test structure which not only fits well into the DRAM cell array configuration, but also requires no additional processing steps. Only minor mask alterations are required.

Young, et.al. U.S. Pat. No. 5,235,549 describe a design for testing individual memory cells by first disabling peripheral input/output circuitry which interferes with the characterization of individual memory cells. Individual cells may then be addressed and their characteristics as memory cells may be observed. Their testing, however, is limited to the characterization of the cells ability to handle signal data and does not address the measurement of electrical parameters and performance of the cells component devices.

SUMMARY OF THE INVENTION

It is an object of this invention to describe a test structure which can be used to perform electrical testing of MOSFETS in individual DRAM cells without a resistive drain connection, thereby yielding accurate measurements of drain voltage.

This object is accomplished by making contact to the MOSFET drain with a direct connection to the capacitor storage plate using a tungsten plug in the ILD layer. No additional processing steps are needed to form this connection since the connection is made concurrent with contact formation and first metallization. Only minor photomask alterations are required.

An additional advantage of the novel drain connection is that, by making contact through the ILD layer from above, no wordlines or bitlines are sacrificed. The drain connection is direct as opposed to alternative designs which use complex conductive paths involving polysilicon and diffusions in the silicon.

BRIEF DESCRIPTION OF THE DRAWINGS

FIG. 1 is a cross sectional view of a tubular stacked capacitor DRAM with a buried bitline.

FIG. 2 is a top view of a portion of a tubular stacked capacitor DRAM with a buried bitline.

DESCRIPTION OF THE PREFERRED EMBODIMENTS

Accordingly, the formation of a first embodiment of this invention is described. The form and shape of the structural modification will become clear as steps of its formation are recited. Details of the processing steps not directly related to the structure of the invention will not be specifically described and are considered well known by those skilled in the art.

Figure 3:
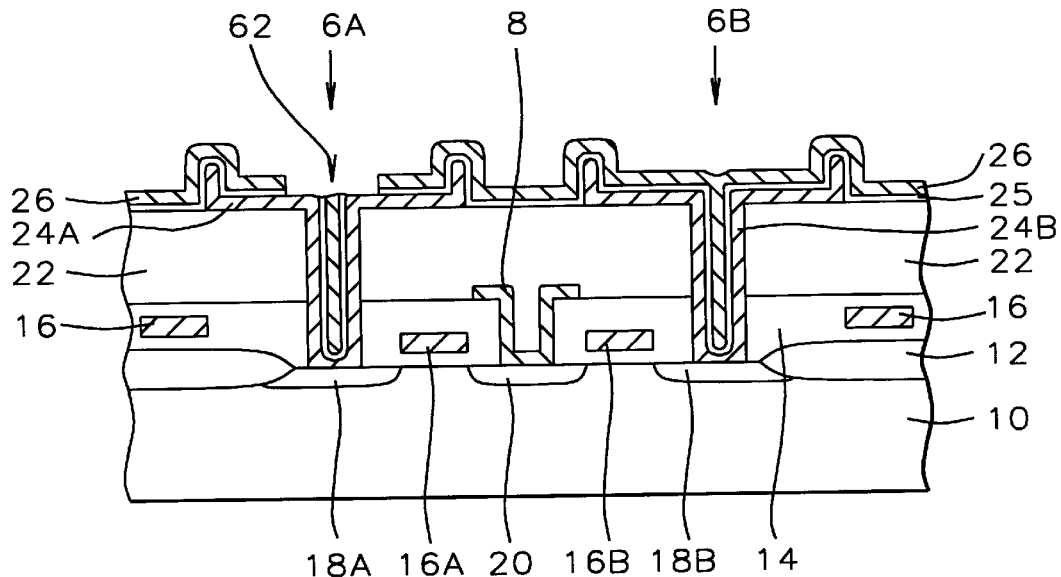
FIG. 3 is a cross section of a portion of a tubular stacked capacitor DRAM test array after an initial step in the formation of a conductive path to a MOSFET drain as taught by a first embodiment of this invention.

The cross section in FIG. 3 represents a portion of a full sized dummy DRAM cell array which comprises a DRAM test structure. The embodiments of this invention provide additional elements to this test structure which permit the desired electrical characteristics of the MOSFET, for example the threshold voltage, to be measured.

For the first embodiment a p-doped <100> oriented monocrystalline silicon wafer 10 is provided. The wafer is processed using conventional DRAM manufacturing procedures to the point where n-channel MOSFET devices with diffused regions 18A, 18B and 20 have been formed within the wafer surface by well known implantation techniques. The self-aligned polysilicon gates 16A and 16B of these MOSFETs form the DRAM word lines. A first inter-polysilicon insulating layer(IPO)14 is deposited and the polysilicon bit line 8 is formed, contacting the diffusion 20, through an opening in IPO layer 14. A second IPO layer 22 is deposited and the lower polysilicon storage plates 24A and 24B of the tubular storage capacitors 6A and 6B respectively, are formed using multiple deposition and etching steps, similar to those taught by Dennison. A dielectric layer 25, for example $SiO_2/Si_3N_4/SiO_2$ (ONO), is next deposited. The capacitors 6A and 6B are completed by the deposition of a layer of doped polysilicon 26 which forms the upper cell plate. The cell plate is patterned with photoresist and covers the entire cell array.

In addition to the characteristic cell plate pattern, the photomask for the cell plate 26 contains an opening 62 located above the storage capacitor 6A where a tungsten plug will subsequently be formed. The polysilicon layer and the subjacent ONO 25 are etched leaving the opening 62 in the cell plate 26. The opening 62 is made larger than the breadth the tungsten plug so that the subsequently deposited insulative layer 28 isolates the tungsten plug from the cell plate 26.

Figure 4:
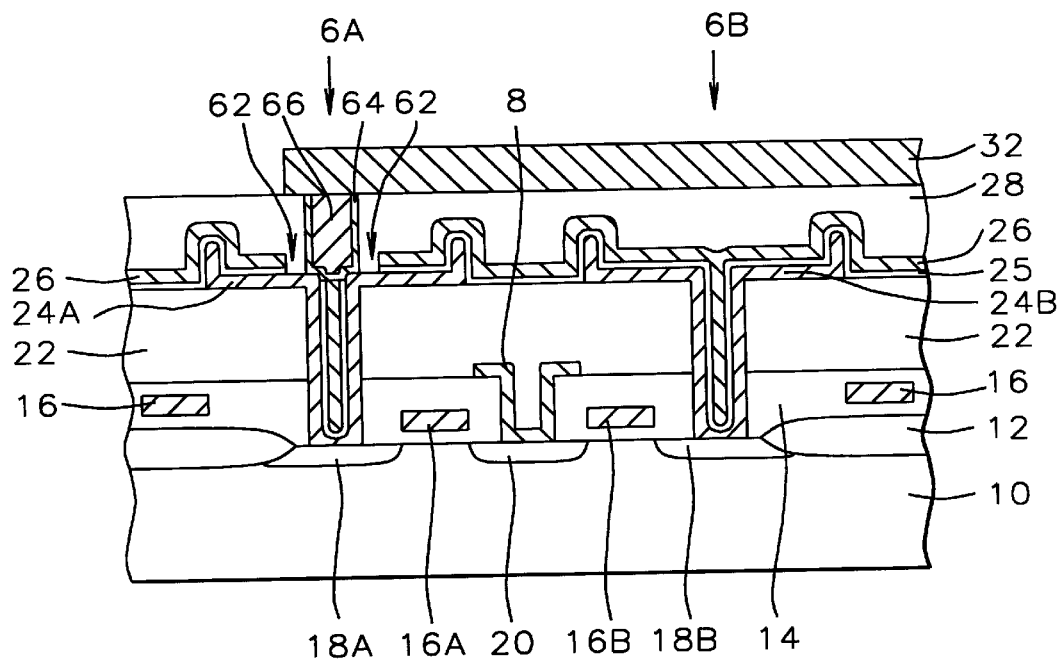
FIG. 4 is a cross section of a portion of a tubular stacked capacitor DRAM test array which has been provided with a conductive path to a MOSFET drain as taught by a first embodiment of this invention.

Referring now to FIG. 4, an interlevel-dielectric layer (ILD) 28, for example borophosphosilicate glass(BPSG), is formed over the wafer. This layer is planarized, for example by chemical-mechanical-polishing(CMP), and an opening for the tungsten plug contact 66 is etched through it. The opening is smaller in breadth than the cell plate opening so that the tungsten plug 66 is insulated from the cell plate. The opening for the tungsten plug 66 in the ILD 28 is formed concurrently with the peripheral contact etch. The polysilicon storage plate 63 of the capacitor 6A is exposed by this contact etch.

A barrier/glue layer of Ti/TiW or Ti/TiN 64 is deposited in the contact opening followed by the formation of a tungsten plug 66. The procedures for the formation of tungsten plugs are well documented and are part of standard DRAM processing. The tungsten plug 66 is formed concurrently with tungsten plug contacts to circuits in the periphery of the DRAM cell array, so that additional processing steps are not required.

A metal wiring stripe 32 then is formed contacting the tungsten plug 66. Its formation is concurrent with the formation of the first metal wiring level of the DRAM interconnection circuitry. The metal stripe 32 leads to a termination, for example a probe pad, accessible by test instrumentation.

The completed wiring path to the drain diffusion 18A consists of the storage plate 24A of the storage capacitor 6A, the barrier/glue layer 64, the tungsten plug 66, and the metal stripe 32. Multiple ohmic contact to DRAM MOSFET drains may be provided at discrete portions of the dummy array. The wiring stripes 32 may pass, unencumbered, to probe pads conveniently located outside the array.

Figure 5:
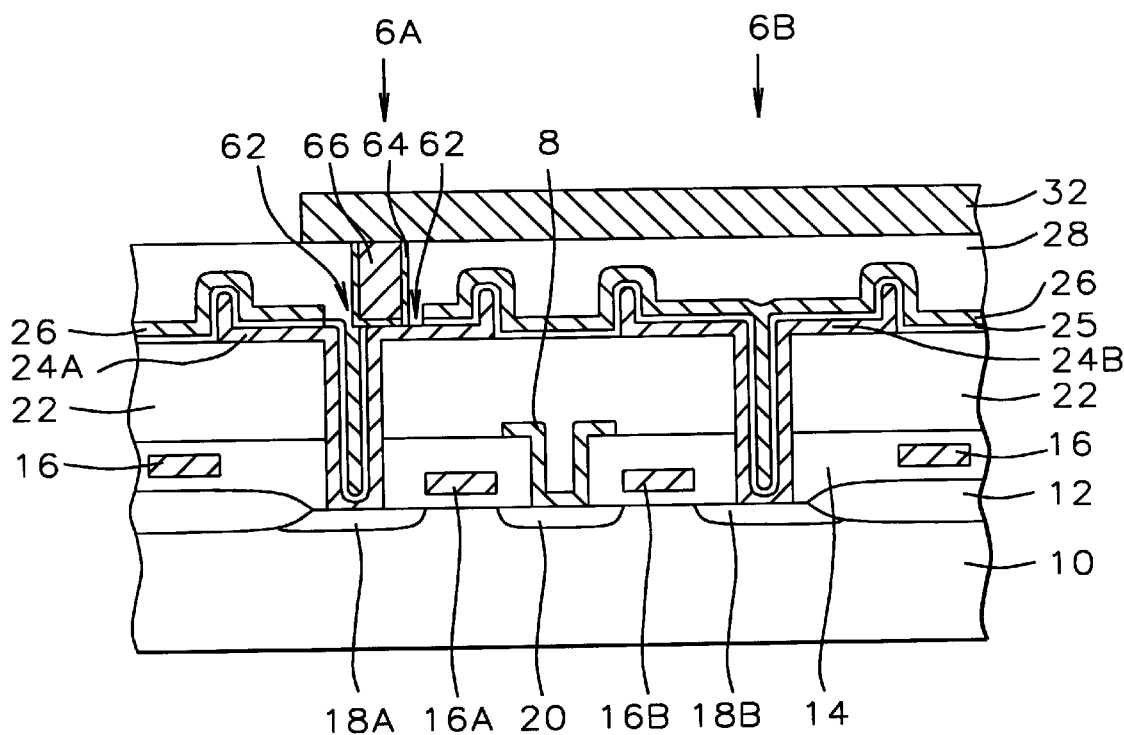
FIG. 5 is a cross section of a portion of a tubular stacked capacitor DRAM test array which has been provided with a conductive path to a MOSFET drain as taught by a second embodiment of this invention.

A second embodiment of this invention is shown in its completed form in FIG. 5. Whereas, in the first embodiment, the tungsten plug 66 straddles the main pillar of the lower storage plate 24A, it may not always be possible to achieve sufficient contact area between the base of the tungsten plug 66 and the pillar. This depends upon the relationship between the widths of the standard tungsten plugs used in the process, and the widths of the storage contact pillars. If the standard tungsten plugs used in the process are smaller in width than the storage plate pillars, the tungsten contact 66 may be offset on the pillar and placed over a horizontal portion of the lower plate 24A as shown in FIG. 5. This placement assures an adequate contact.

Figure 6:
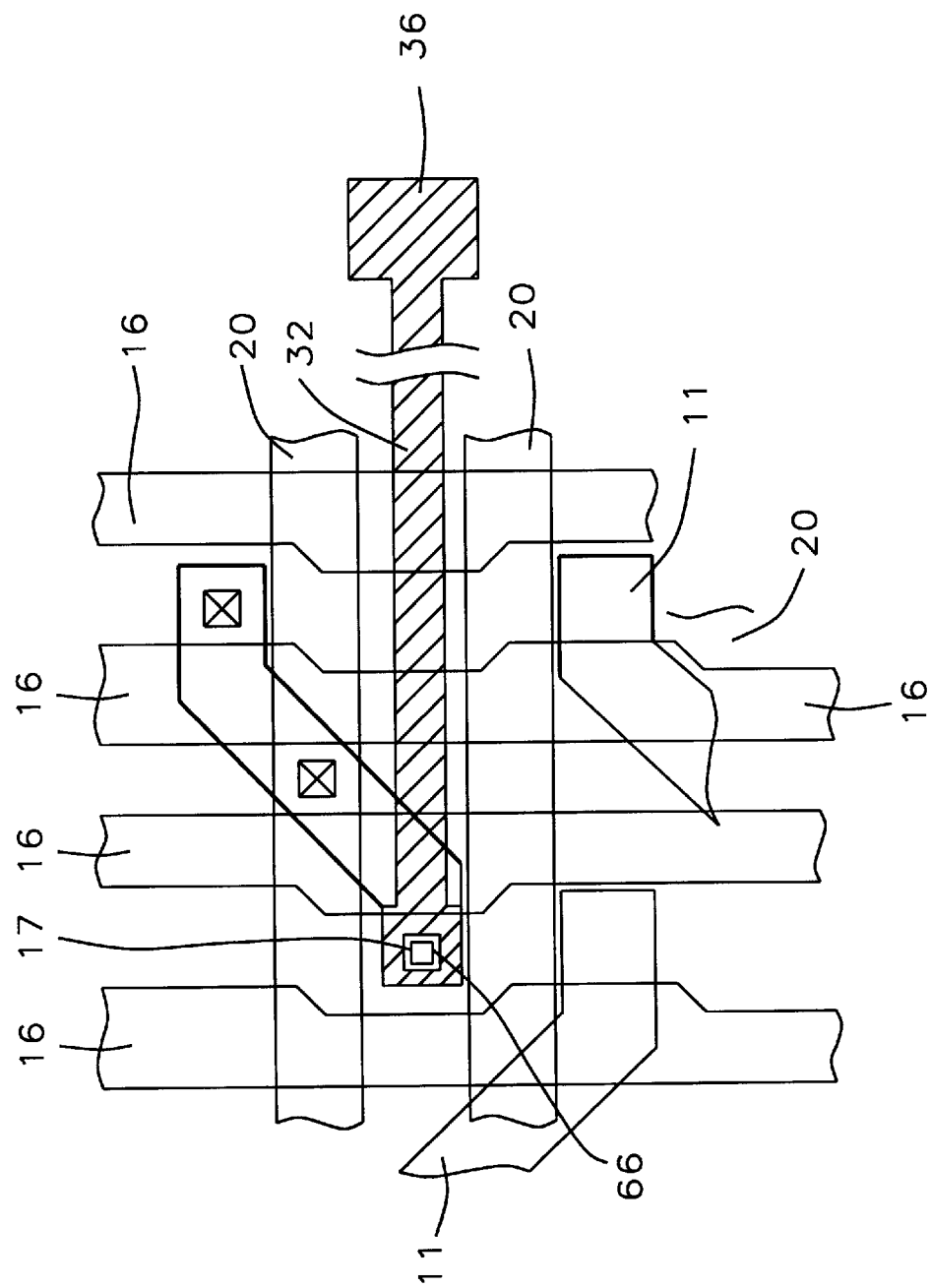
FIG. 6 is a top view of a portion of a DRAM test structure having a conductive path to a MOSFET drain as taught by this invention.

In FIG. 6 there is shown a top view of a DRAM dummy array having diagonal active areas 11. The mutually perpendicular wordlines 16 and bitlines 20 are shown in relation to these active regions 11. Bitline contacts 19 and capacitor storage plate contacts 17 are also shown. The layout of a single metal stripe 32 leading from a probe pad 36 to a tungsten plug contact 66 formed as described in the first and second embodiments is shown. It is evident from this top view that the external conductive path formed in accordance with these embodiments can address multiple cells in any part of the array without interfering with the array functionality, save for the modified cells themselves.

The embodiments described uses a p-type silicon wafer. It should be well understood by those skilled in the art that n-type substrate conductivities may also be used. It should be further understood that the substrate conductivity type as referred to here does not necessarily refer to the conductivity of the starting wafer but could also be the conductivity of a diffused region within a wafer wherein the semiconductor devices are incorporated. Such situations are encountered in twin-well CMOS technology.

The well known DRAM configuration shown in FIG. 1 acts as the reference for these and other embodiments although the features of these embodiments are equally adaptable to others of the many published stacked capacitor DRAM configurations.

While the invention has been particularly shown and described with reference to the preferred embodiments thereof, it will be understood by those skilled in the art that various changes in form and details may be made without departing from the spirit and scope of the invention.

What is claimed is:

1. A structure for making an external electrical contact to the MOSFET drain of a stacked capacitor DRAM cell comprising:

(a) a MOSFET formed on a silicon wafer;
   (b) a polysilicon wordline forming the gate of said MOSFET;
   (c) a polysilicon bitline in contact with the source of said MOSFET;
   (d) a stacked capacitor having a storage plate in contact with the drain of said MOSFET through a pillar and a cell plate separated from said storage plate by a dielectric layer;
   (e) a first opening in said cell plate and said dielectric layer over said storage plate;
   (f) an insulative layer over said cell plate and in said first opening;
   (g) a conductive plug formed in a second opening in said insulative layer, said second opening being smaller than, and concentric with said first opening, passing through said first opening, thereby making ohmic contact with said storage plate and being insulated from said cell plate by said insulative layer;
   (h) a metal stripe over said insulative layer in ohmic contact with said conductive plug; and
   (i) a probe pad connected to said metal stripe.

2. The structure of claim 1 wherein said storage plate and said cell plate are doped polysilicon.

3. The structure of claim 1 wherein said conductive plug is tungsten.

4. The structure of claim 1 wherein said metal stripe is an aluminum alloy.

5. The structure in claim 1 wherein said first opening is concentric with said pillar.

6. The structure in claim 1 wherein said first opening is offset from the centerline of said pillar.

* * * * *